United States Patent
Ahmed et al.

(10) Patent No.: US 12,140,693 B2
(45) Date of Patent: Nov. 12, 2024

(54) MONITORING IMPEDANCE MATCHING OF A RECEIVE ANTENNA AND MONITORING A RECEIVE CHAIN USING A TEST SIGNAL

(71) Applicant: Infineon Technologies AG, Neubiberg (DE)

(72) Inventors: Faisal Ahmed, Linz (AT); Muhammad Furqan, Linz (AT)

(73) Assignee: Infineon Technologies AG, Neubiberg (DE)

( * ) Notice: Subject to any disclaimer, the term of this patent is extended or adjusted under 35 U.S.C. 154(b) by 356 days.

(21) Appl. No.: 17/643,110

(22) Filed: Dec. 7, 2021

(65) Prior Publication Data

US 2023/0176185 A1    Jun. 8, 2023

(51) Int. Cl.
*G01S 7/40* (2006.01)
*G01R 29/08* (2006.01)
*H01Q 3/26* (2006.01)

(52) U.S. Cl.
CPC ........ *G01S 7/4004* (2013.01); *G01R 29/0892* (2013.01); *H01Q 3/267* (2013.01)

(58) Field of Classification Search
CPC  G01R 27/32; G01R 29/0892; G01R 31/2822; G01R 31/66; G01S 7/4004; H01Q 3/267; H04B 17/0085; H04B 17/103
See application file for complete search history.

(56) References Cited

U.S. PATENT DOCUMENTS

| | | | | |
|---|---|---|---|---|
| 6,100,841 A | * | 8/2000 | Toth | H01Q 25/02 342/149 |
| 6,603,810 B1 | * | 8/2003 | Bednekoff | H04B 17/0085 375/228 |
| 11,038,249 B1 | * | 6/2021 | Tsironis | H01P 5/04 |
| 2006/0154635 A1 | * | 7/2006 | Chan | H04B 1/109 455/280 |
| 2010/0121318 A1 | * | 5/2010 | Hancock | A61B 5/0507 342/174 |
| 2013/0082869 A1 | | 4/2013 | Jaege et al. | |
| 2017/0207812 A1 | * | 7/2017 | Wyville | H04B 1/525 |
| 2020/0252115 A1 | * | 8/2020 | Paramesh | H04B 1/18 |
| 2021/0013602 A1 | * | 1/2021 | Bates | G01S 7/4052 |
| 2021/0055377 A1 | * | 2/2021 | Itkin | H03H 7/38 |

* cited by examiner

*Primary Examiner* — Timothy A Brainard
(74) *Attorney, Agent, or Firm* — Harrity & Harrity, LLP

(57) ABSTRACT

A device may include a receive antenna input to couple a receive antenna to a receive chain of the device. The device may include a test signal generator to generate a test signal. The device may include a signal coupler between the receive antenna input and the receive chain. The signal coupler may include a first port to inject the first test signal into the receive antenna via the receive antenna input. The device may include a control circuit to monitor an impedance matching of the receive antenna based on one or more characteristics of a reflected signal resulting from the first test signal being injected into the receive antenna. The one or more characteristics of the reflected signal may be dependent on the impedance matching of the receive antenna.

22 Claims, 12 Drawing Sheets

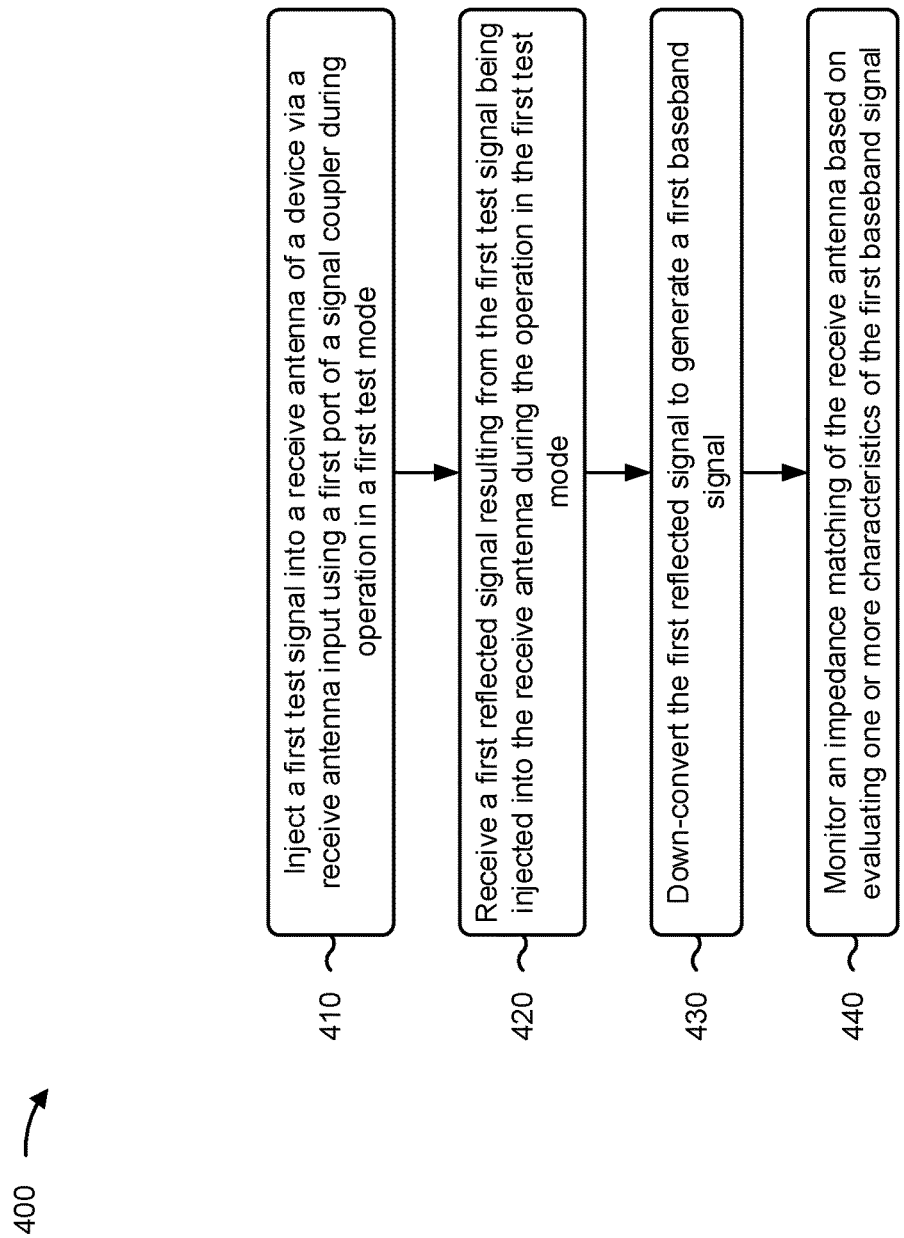

MONITORING IMPEDANCE MATCHING OF A RECEIVE ANTENNA AND MONITORING A RECEIVE CHAIN USING A TEST SIGNAL

BACKGROUND

A radio frequency (RF) device, such as a radar monolithic microwave integrated circuit (MMIC), may need to evaluate a quality of a connection of an antenna in purposes of providing functional safety. Monitoring a quality of a connection of an antenna is particularly important for an application that utilizes an RF device in a vehicle, such as an advanced driver-assistance system (ADAS) application.

SUMMARY

In some implementations, a device includes a receive antenna input to couple a receive antenna to a receive chain of the device; a test signal generator to generate a first test signal; a signal coupler between the receive antenna input and the receive chain, the signal coupler comprising a first port to inject the first test signal into the receive antenna via the receive antenna input during operation in a first test mode; a mixer, included in the receive chain, to: receive a first reflected signal resulting from the first test signal being injected into the receive antenna during the operation in the first test mode, and down-convert the first reflected signal to generate a first baseband signal; and a control circuit to monitor an impedance matching of the receive antenna based on evaluating one or more characteristics of the first baseband signal.

In some implementations, a method includes injecting a first test signal into a receive antenna of a device via a receive antenna input using a first port of a signal coupler during operation in a first test mode; receiving a first reflected signal resulting from the first test signal being injected into the receive antenna during the operation in the first test mode; down-converting the first reflected signal to generate a first baseband signal; and monitoring an impedance matching of the receive antenna based on evaluating one or more characteristics of the first baseband signal.

In some implementations, a device includes a signal coupler configured to: inject a first test signal into a receive antenna via a receive antenna during operation in a first test mode, and inject a second test signal into a receive chain during operation in a second test mode; and a control circuit to: monitor an impedance matching of the receive antenna based at least in part on one or more characteristics associated with a reflected signal resulting from the first test signal being injected into the receive antenna during the operation in the first test mode, and monitor the receive chain based at least in part on one or more characteristics associated with a signal resulting from the second test signal being injected into the receive chain during the operation in the second test mode.

BRIEF DESCRIPTION OF THE DRAWINGS

FIG. 4 is a flowchart of an example process relating to monitoring impedance matching of an RX antenna or monitoring an RX chain using a test signal, as described herein.

DETAILED DESCRIPTION

Figure 1A:
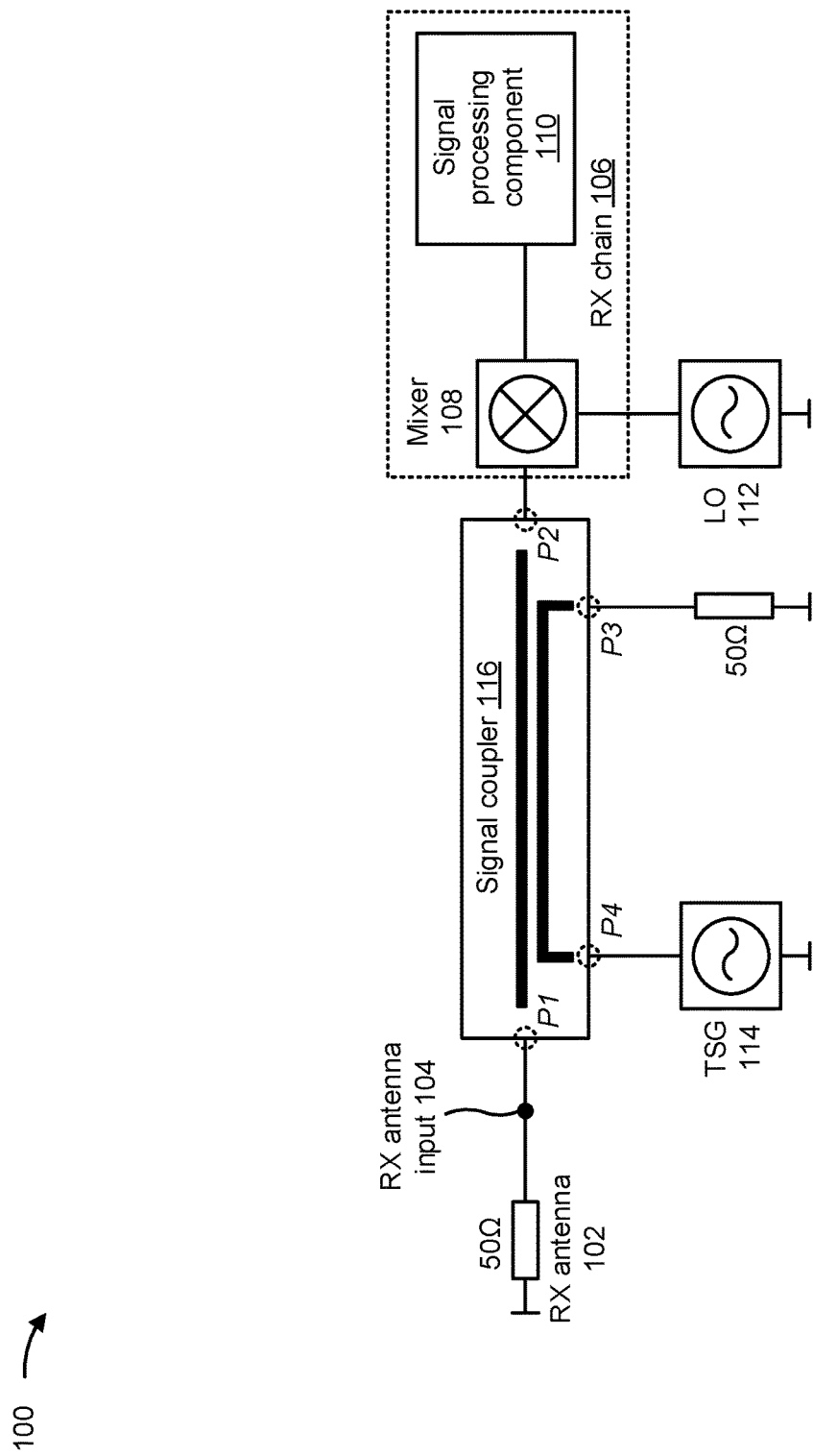
FIGS. 1A-1C are diagrams associated with a first example implementation of a radio frequency (RF) device capable of monitoring impedance matching of a receive (RX) antenna or monitoring an RX chain using a test signal, as described herein.

The following detailed description of example implementations refers to the accompanying drawings. The same reference numbers in different drawings may identify the same or similar elements.

A radio frequency (RF) device, such as a radar monolithic microwave integrated circuit (MMIC), may need to evaluate a quality of a connection of an antenna. In a transmit (TX) path, a measurement of an impedance of the antenna may in some cases be used to evaluate a quality of a connection of the antenna. Here, a reflection of a transmitted signal coming from the antenna can be used to detect the antenna impedance and, therefore, a quality of the connection from the TX path to the antenna can be derived. However, there is no transmitted signal in a receive (RX) path and, therefore, there is no reflected signal readily available to be used for evaluation of a connection in the RX path. Rather, in the case of an RX path, an RF device typically determines whether an RF ball of the RF device is connected to a printed circuit board (PCB) of the RF device in association with performing such an evaluation.

Similarly, the RF device may need to verify that one or more components of an RX chain of the RF device are operating according to an applicable specification. In some cases, the RF device may use an RX monitoring procedure in order to perform this verification. A result of the RX monitoring procedure can, however, be impacted by the presence of external distortions received via an antenna of the RF device during performance of the RX monitoring.

A safety requirement, such as a functional safety requirement in an automotive context, may require monitoring of a connection of an RX antenna in an RF device. Conventionally, the connection of the RX antenna is monitored using a ball break detection (BBD) technique. In general, the BBD technique is performed by forcing a direct current (DC) through the antenna connection, observing a relative change of voltage occurring on a series resistor, and then evaluating the connection based on the observed relative change of voltage. Notably, the BBD technique requires that there is no DC connection to ground in the RF device. However, a DC connection to ground may be needed, for example, to enable operation of an input balun or for protection from electrostatic discharge (ESD) in the RF device. Further, the BBD technique is limited to monitoring DC connectivity, and cannot provide any information regarding RF impedance. Consequently, the BBD technique also cannot provide any information regarding a phase of a signal path, meaning that a phase change on the signal path cannot be detected. Additionally, because the BBD technique is based on a comparison of voltages, a result is dependent on process, voltage, and temperature (PVT) variation of a reference resistor and PVT variation of a reference current, thereby reducing reliability of the BBD technique.

Some implementations described herein provide techniques and apparatuses for an RF device capable of monitoring impedance matching of an RX antenna or monitoring an RX chain using a test signal. In some implementations, an RF device includes an RX antenna input to couple an RX antenna to an RX chain of the RF device, and a test signal generator to generate a first test signal. The RF device further includes a signal coupler between the RX antenna input and the RX chain, where the signal coupler includes a first port to inject the first test signal into the RX antenna via the RX antenna input during operation in a first test mode. The RF device further includes a mixer, included in the RX chain, to receive a first reflected signal resulting from the first test signal being injected into the RX antenna during the operation in the first test mode, and to down-convert the first reflected signal to generate a first baseband signal. The RF device further includes a control circuit to monitor an impedance matching of the RX antenna based on evaluating one or more characteristics of the first baseband signal. Additional implementations and details are provided below.

In some implementations, the RF device described herein is capable of monitoring an impedance matching of an RX antenna and/or is capable of monitoring an RX chain. The monitoring of the impedance matching of the RX antenna allows direct monitoring the RX antenna connection based on the monitoring of the impedance matching. Notably, the RF device described herein does not rely on an open DC connection to ground, meaning that operation of an input balun can be enabled and protection from ESD can be provided. Further, the RF device described herein is capable of detecting an imperfect connection of an RF ball (e.g., as compared to the BBD technique, where only a complete disconnection can be detected). Additionally, the RF device described herein may be capable of detecting RF phase perturbation (e.g., phase changes or phase anomalies caused by fatigue on the RX path) indicating for example a beginning of RF connection deterioration based on a measured phase of a reflected signal. Furthermore, an impact on a front-end of the RF device described herein is minimized because no component needs to be added directly on the RX path to enable the monitoring of the impedance matching of the RX antenna or the monitoring of the RX chain. Additionally, in some implementations, the RF device described herein may be capable of (1) measuring complex antenna impedance, (2) providing interference suppression during a monitoring cycle, or (3) providing improved accuracy of RF terminations during a production test performed for the RF device.

Notably, in some RF devices, an impedance matching of an RX antenna can be indirectly monitored using a technique that requires manipulation of an impedance matching of a test signal generator. In such an RF device, information regarding a phase of a signal path is not available, meaning that a phase change on the signal path cannot be detected. Further, an impact on the signal path can be significant (e.g., a noise figure (NF) of the signal path increases) in such RF devices due to the placement of switches or other components (e.g., inductors or capacitors with finite quality (Q) factor values) directly on the signal path. Additionally, the manipulation of the impedance matching of the test signal generator increases gain variation over process and temperature because typically all components placed on the signal path have an associated variation over process and temperature.

As compared to RF devices that utilize manipulation of the impedance matching of the test signal generator, the RF device described herein provides a direct method to monitor the impedance matching of the RX antenna (e.g., by measuring a reflected signal and, optionally, an incident signal through a signal coupler). Further, the RF device described herein can obtain information regarding a phase of the reflected signal, which can be used to assess an impact of fatigue of the antenna connection on a phase shift of the signal path. Additionally, an impact on the signal path (e.g., an impact on NF, an impact on gain) during regular operation of the RF device (e.g., receiving of RF signals through the RX antenna and transferring the received signals to a receive processing path for processing) is negligible with respect to the RF device described herein because components needed for monitoring are placed on a coupled port of the signal coupler (e.g., rather than being placed directly on the signal path). Consequently, an impact on gain variation of the RX chain in the RF device described herein is negligible.

Figure 1B:
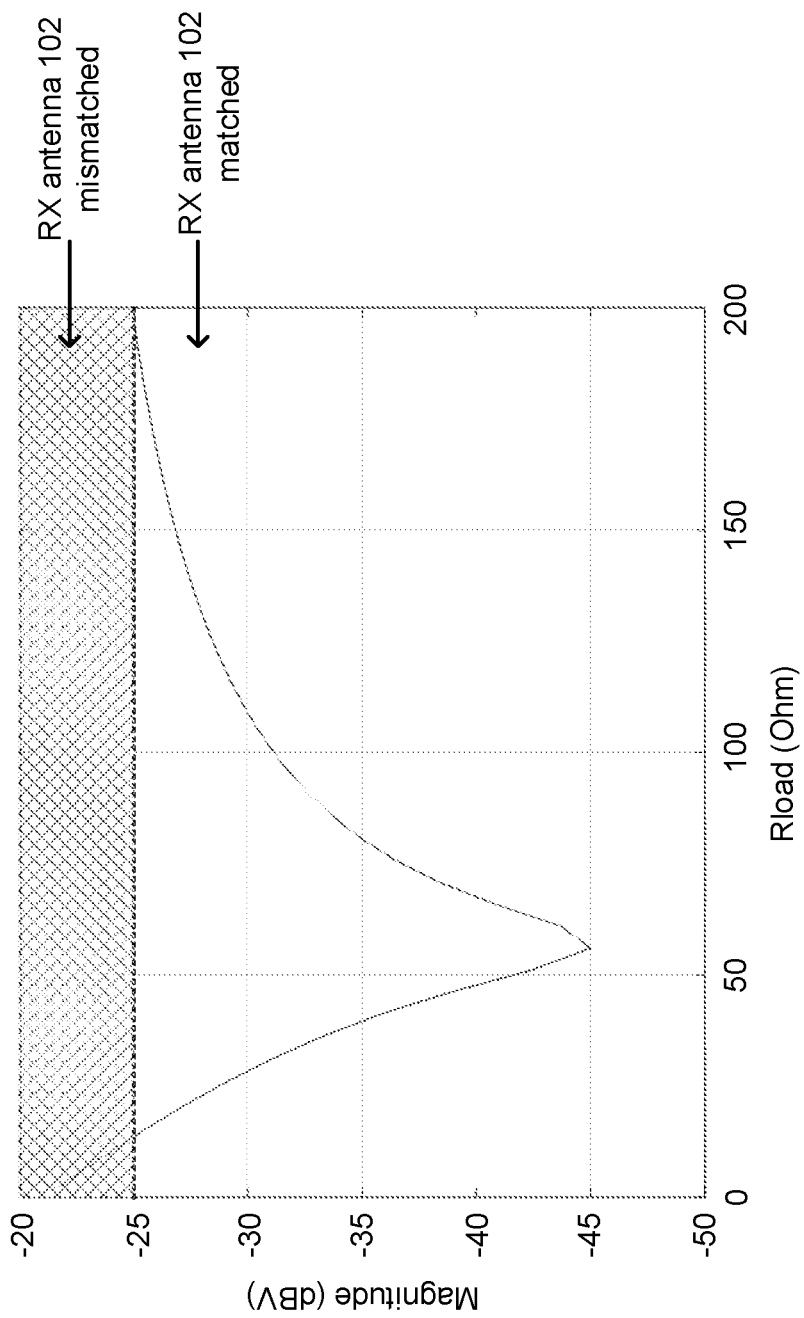
Figure 1C:
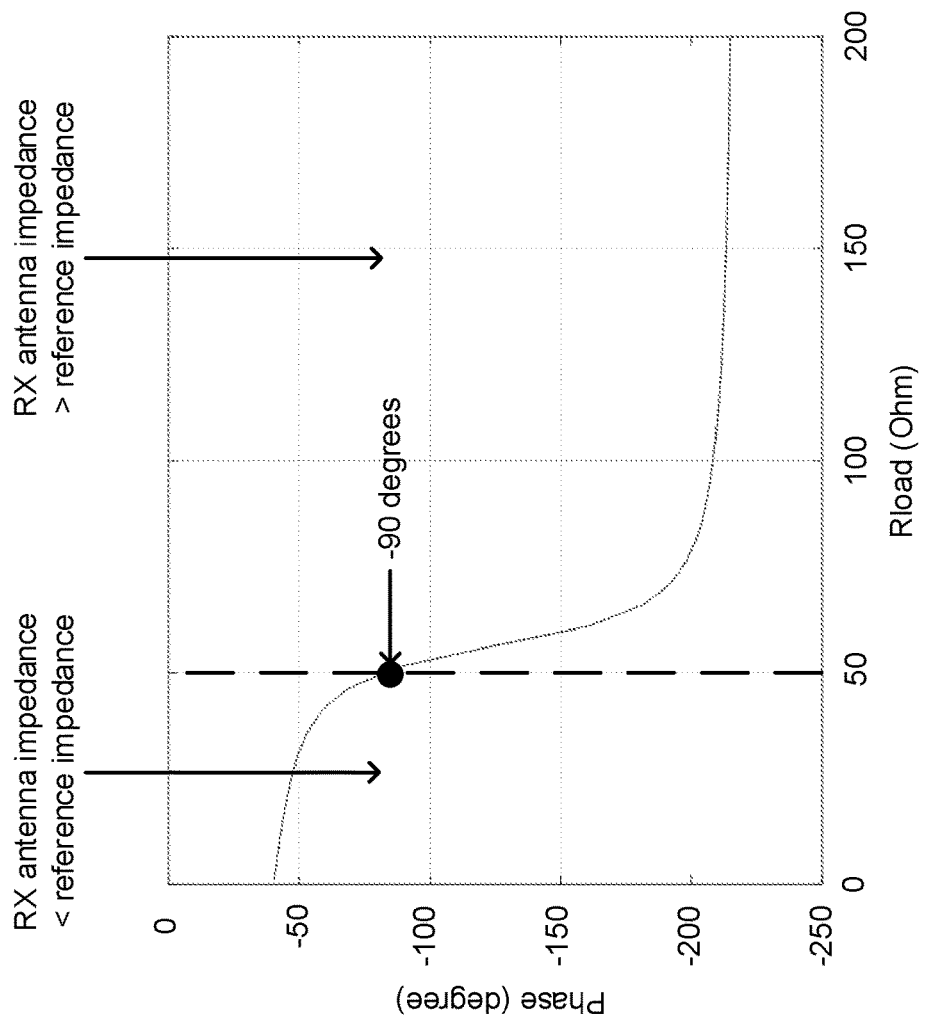

FIGS. 1A-1C are diagrams associated with a first example implementation of an RF device 100 capable of selectively monitoring impedance matching of an RX antenna or monitoring an RX chain using a test signal. As shown in FIG. 1A, the RF device 100 may include an RX antenna 102, an RX antenna input 104, an RX chain 106 comprising a mixer 108 and a signal processing component 110, a local oscillator (LO) 112, a test signal generator (TSG) 114, and a signal coupler 116.

The RX antenna 102 includes an antenna to receive radio waves and produce an electrical signal (i.e., an RF signal). The RX antenna 102 is coupled to the RX antenna input 104 of the RF device 100, which enables the RF signal produced by the RX antenna 102 to be provided to other components of the RF device 100 (e.g., the RX chain 106) for signal processing. In the RF device 100, the RX antenna 102 has an impedance of 50 Ohms ($\Omega$).

The RX chain 106 includes one or more components and/or sub-components forming a receive chain of the RF device 100. For example, the RX chain 106 may include the mixer 108, the signal processing component 110, and one or more other components. The one or more other components of the RX chain 106 may include, for example, one or more amplifiers, one or more filters, one or more additional mixers, one or more attenuators, one or more detectors, or the like.

The mixer 108 includes a component to mix an RF signal with an LO signal in association with performing frequency conversion of the RF signal to another frequency, such as an intermediate frequency (IF) or a baseband frequency (e.g., by multiplying the RF signal and the LO signal). In some applications, the RF device 100 is a frequency modulated continuous wave radar device. In this implementation, a signal received by the RX antenna 102 is converted by the mixer 108 into a baseband signal. This baseband signal can be further processed (external or internal) to generate a multi-dimensional map indicating distance and velocity of objects (e.g., a Range-Doppler map). In a first test mode the mixer 108 may be configured to down-convert a first reflected signal (e.g., an RF signal resulting from a first test signal being injected into the RX antenna 102 during operation in a first test mode) to generate a first baseband signal. As another example, in some implementations, the mixer 108 may be configured to down-convert in a second test mode a second test signal (e.g., an RF signal resulting from the second test signal being injected into the RX chain 106 during operation in a second test mode) to generate a second baseband signal. In some implementations, the mixer 108 may convert a given RF signal to a baseband signal to enable further signal processing by the signal processing component 110.

The signal processing component 110 includes one or more components associated with processing signals generated by the mixer 108. For example, the signal processing component 110 may include an analog front end (AFE), one or more analog-to-digital converters (ADCs), a digital front end (DFE), or the like. In some implementations, the AFE may filter and/or process a given signal to create an amplified and filtered signal for conversion by the one or more ADCs. The one or more ADCs may convert the amplified/filtered signal from the analog domain to the digital domain. The DFE may process a digital signal provided by the one or more ADCs, and output a processed digital signal. In some implementations, the signal processing component 110 includes or is coupled to a control circuit (not shown) configured to monitor the impedance matching of the RX antenna 102 or to monitor the RX chain 106, as described herein. In some implementations, the control circuit may be included in another component of the RF device 100 or may be a discrete component of the RF device 100. In some implementations, the control circuit may indicate a failure signal or warning signal based on the monitoring of the RX antenna 102 or the RX chain 106. The failure signal may indicate a failure of the RX antenna 102, a connection of the RX antenna 102, or the RX chain 106. The warning signal may indicate a degradation of the RX antenna 102, a connection of the RX antenna 102, or a degradation of the RX chain 106 (which could become a failure).

In some implementations, the signal processing component 110 may include one or more other components not shown in FIG. 1A. For example, the signal processing component 110 may include one or more ADCs configured to generate a digitized version of a signal (e.g., a digitized version of a first reflected signal, a digitized version of a second test signal, or the like), a digital Fourier transformation circuit configured to process the digitized version of the signal (e.g., the digitized version of the first reflected signal, the digitized version of the second test signal, or the like).

The LO 112 includes an oscillator that provides the LO signal for mixing by the mixer 108. In some implementations, the LO 112 may be coupled to the mixer 108 such that the mixer 108 can use the LO signal to down-convert an RF signal to an IF signal or baseband signal, as described above.

The TSG 114 includes a component capable of generating test signals based on which monitoring of the impedance matching of the RX antenna 102 or monitoring of the RX chain 106 can be performed, as described herein. In some implementations, the TSG 114 is coupled to a particular port of the signal coupler 116 (e.g., port P4 as shown in FIG. 1A). The signal coupler 116 may be a 4-port coupler, such as a directional 4-port coupler. In some implementations, a coupling of the TSG 114 to a port of the signal coupler 116 may be switchable such that the TSG 114 is coupled during a first test mode (e.g., antenna matching testing) to a first port to transfer signals to the first port and the TSG 114 is coupled during a second test mode (e.g., receive chain testing) to a second port of the TSG 114 to transfer signals to the second port (e.g., such that the TSG 114 is can be coupled to either the port P4 or the port P3 of the signal coupler 116), as described herein. In some implementations, a given test signal generated by the TSG 114 may be an RF signal. In some implementations, a frequency of a given test signal generated by the TSG 114 is greater than approximately 10 gigahertz (GHz). In some implementations, a frequency of a given test signal generated by the TSG 114 is within an operating range of the RX antenna 102 (e.g., a frequency range in which the RX antenna 102 is configured to operate, such as a frequency range near 77 GHz).

The signal coupler 116 includes a component to inject a test signal into one or more other components of the RF device 100. For example, in some implementations, the signal coupler 116 may be configured to inject a first test signal into the RX antenna 102 via the RX antenna input 104 (e.g., during operation in a first test mode). As another example, in some implementations, the signal coupler 116 may be configured to inject a second test signal into the RX chain 106 (e.g., during operation in a second test mode). In some implementations, as illustrated in FIG. 1A, the signal coupler 116 is between the RX antenna input 104 and the RX chain 106. In some implementations, the first port of the signal coupler 116 (e.g., port P4 in FIG. 1A) is coupled to the TSG 114 and a second port (e.g., port P3 in FIG. 1A) is isolated (e.g., through a connection to a 50 Ω load).

In some implementations, as illustrated in FIG. 1A, the signal coupler 116 is a four-port device. In such an implementation, a third port of the signal coupler 116 (e.g., port P1 in FIG. 1A) may be coupled to the RX antenna input 104 and a fourth port of the signal coupler 116 (e.g., port P2 in FIG. 1A) may be coupled to the RX chain 106. In some implementations, the signal coupler 116 includes a forward-wave coupled line directional coupler, a backward-wave coupled line directional coupler, a Lange coupler, a branch-line coupler, a rat-race ring coupler, or another type of directional coupler. In some implementations, the signal coupler 116 has a directivity that is greater than or equal to approximately 10 decibels (dB). The directivity of the signal coupler 116 is a parameter of the signal coupler 116 that determines a level of a signal propagating in an unwanted direction (e.g., in a direction toward the RX chain 106 when the signal coupler 116 injects a first test signal into the RX antenna 102, in a direction toward the RX antenna 102 when the signal coupler 116 injects a second test signal into the RX chain 106). Therefore, in practice, a robustness or accuracy of the monitoring of the impedance matching of the RX antenna 102 is improved with a higher directivity of the signal coupler 116. In some cases, a signal coupler having a directivity of less than approximately 10 dB would result in a significant reduction in robustness.

In an example operation of the RF device 100 shown in FIG. 1A in a first test mode (also referred to a reflected signal test mode), the TSG 114 generates a first test signal. Here, the TSG 114 is coupled to the port P4 of the signal coupler 116 such that the signal coupler 116 injects the first test signal into the RX antenna 102 (via the RX antenna input 104). The signal coupler 116 is configured such that a power of a portion of the first test signal that is propagating in a direction toward the RX antenna 102 when the first test signal is injected at the port P4 is higher than a power of a portion of the first test signal that is propagating in a direction toward the RX chain 106 when the first test signal is injected at the port P4. Continuing with this example, the first test signal is reflected by the RX antenna 102, and a first reflected signal (e.g., a signal resulting from the first test signal being injected into the RX antenna 102 and reflected by the RX antenna 102) passes through the signal coupler 116 and is received at the RX chain 106 by the mixer 108. The mixer 108 utilizes the LO signal from the LO 112 to down-convert the first reflected signal to generate a first baseband signal, and provides the first baseband signal to the signal processing component 110. A control circuit included in the signal processing component 110 then monitors the impedance matching of the RX antenna 102 based on evaluating one or more characteristics of the first baseband signal. In some implementations, the monitoring of the impedance matching of the RX antenna 102 performed by the control circuit is associated with detecting a connection failure such as a ball break or a partial ball break of a connection of the RX antenna 102, detecting an RF short at the RX antenna 102, detecting an RF open at the RX antenna 102, or detecting fatigue on a signal path of the RX chain 106, as described below.

A magnitude of the first reflected signal, and therefore a magnitude of the first baseband signal, is dependent on the impedance matching of the RX antenna 102. Therefore, in some implementations, the control circuit monitors the impedance matching of the RX antenna 102 based at least in part on an evaluation of a magnitude of the first baseband signal. That is, in some implementations, the one or more characteristics of the first baseband signal based at least in part on which the control circuit monitors the impedance matching of the RX antenna 102 include the magnitude of the first baseband signal.

With reference to FIG. 1B, in some implementations, the evaluation of the magnitude of the first baseband signal includes determining whether the magnitude satisfies voltage threshold (e.g., an example voltage threshold of 25 voltage decibels (dBV) is shown in FIG. 1B). In some implementations, the voltage threshold may be a maximum or peak voltage threshold. In such a case, the evaluation may be, for example, a determination of whether the magnitude of the first baseband signal was greater than the maximum or peak voltage at any point during the first test mode. Additionally, or alternatively, the voltage threshold may be a mean voltage threshold. In such a case, the evaluation may be, for example, a determination of whether a mean (e.g., a root mean square (RMS)) of the magnitude of the first baseband signal over a given period of time during the first test mode was greater than the mean voltage threshold. FIG. 1B is a diagram illustrating an example of signal magnitude over a range of impedance. In FIG. 1B, an impedance of approximately 50Ω corresponds to a matched condition, meaning that the magnitude of the first baseband signal is expected to be at a low point. In this example, if the control circuit determines that the magnitude of the first baseband signal satisfies the voltage threshold (e.g., is less than or equal to the voltage threshold), then the control circuit may determine that the RX antenna 102 is matched (e.g., that the impedance of the RX antenna 102 is within an acceptable range). Alternatively, if the control circuit determines that the magnitude of the first baseband signal does not satisfy the voltage threshold (e.g., is greater than the voltage threshold), then the control circuit may determine that the RX antenna 102 is mismatched (e.g., that the impedance of the RX antenna 102 is outside of the acceptable range).

In some implementations, the control circuit may evaluate the magnitude in association with monitoring the impedance matching of the RX antenna 102 in some other manner, such as by providing the magnitude as an input to a function that provides, as an output, an indication of the impedance matching of the RX antenna 102.

Similarly, a phase of the first reflected signal, and therefore a phase of the first baseband signal, is dependent on the impedance matching of the RX antenna 102. Therefore, in some implementations, the control circuit monitors the impedance matching of the RX antenna 102 based at least in part on an evaluation of a phase of the first baseband signal. That is, in some implementations, the one or more characteristics of the first baseband signal based at least in part on which the control circuit monitors the impedance matching of the RX antenna 102 include a phase of the first baseband signal.

For example, as illustrated in FIG. 1C, the phase of the baseband signal varies with impedance of the RX antenna 102. In this example, if the phase is less than approximately-90 degrees, this indicates that the impedance of the RX antenna 102 is greater than a reference impedance of the signal coupler 116. An extreme case of the impedance of the RX antenna 102 being greater than the reference impedance of the signal coupler 116 is indicative of an RF open at the RX antenna 102. Thus, in some implementations, the control circuit may be configured with a low phase threshold that can be used by the control circuit to detect an RF open at the RX antenna 102. In the example shown in FIG. 1C, the low phase threshold may be, for example, −210 degrees. Here, if the control circuit determines that the phase of the first baseband signal satisfies the low phase threshold (e.g., is greater than or equal to the low phase threshold), then the control circuit may determine that the RX antenna 102 is sufficiently matched and that no RF open is present at the RX antenna 102. Conversely, if the control circuit determines that the phase of the first baseband signal does not satisfy the low phase threshold (e.g., is less than the low phase threshold), then the control circuit may determine that the RX antenna 102 is mismatched and/or that an RF open may be present at the RX antenna 102.

Similarly, if the phase is greater than approximately-90 degrees, this indicates that the impedance of the RX antenna 102 is less than the reference impedance of the signal coupler 116. An extreme case of the impedance of the RX antenna 102 being less than the reference impedance of the signal coupler 116 is indicative of an RF short at the RX antenna 102. Thus, in some implementations, the control circuit may be configured with a high phase threshold that can be used by the control circuit to detect an RF short at the RX antenna 102. In the example shown in FIG. 1C, the high phase threshold may be, for example, 45 degrees. Here, if the control circuit determines that the phase of the first baseband signal satisfies the high phase threshold (e.g., is less than or equal to the high phase threshold), then the control circuit may determine that the RX antenna 102 is sufficiently matched and that no RF short is present at the RX antenna 102. Conversely, if the control circuit determines that the phase of the first baseband signal does not satisfy the high phase threshold (e.g., is greater than or equal to the high phase threshold), then the control circuit may determine that the RX antenna 102 is mismatched and/or that an RF short may be present at the RX antenna 102.

In some implementations, the control circuit may evaluate the phase in association with monitoring the impedance matching of the RX antenna 102 in some other manner, such as by providing the phase as an input to a function that provides, as an output, an indication of the impedance matching of the RX antenna 102 or whether there may be an RF open or an RF short (e.g., at the RX antenna 102, at a soldering point of an RF ball, at a site where an RF ball is connected to a MMIC package, or the like).

In some implementations, when monitoring the impedance matching of the RX antenna 102 the control circuit may monitor a complex value of the impedance of the RX antenna 102. In some implementations, by monitoring the complex impedance of the RX antenna 102, both the magnitude and the phase can be used simultaneously to define a threshold. This increases the robustness of the monitoring technique described herein against different variations, such as process, temperature, supply, or the like.

As indicated above, FIGS. 1A-1C are provided as an example. Other examples may differ from what is described with regard to FIGS. 1A-1C. The number and arrangement of components shown in FIGS. 1A-1C are provided as an example. In practice, there may be additional components, fewer components, different components, or differently arranged components than those shown in FIGS. 1A-1C.

Furthermore, two or more components shown in FIGS. 1A-1C may be implemented within a single component, or a single component shown in FIGS. 1A-1C may be implemented as multiple, distributed components. Additionally, or alternatively, a set of components (e.g., one or more components) shown in FIGS. 1A-1C may perform one or more functions described as being performed by another set of components shown in FIGS. 1A-1C.

FIGS. 2A-2E are diagrams associated with a second example implementation of the RF device 100 capable of monitoring impedance matching of an RX antenna or monitoring an RX chain using a test signal. In the second example implementation of the RF device 100, the monitoring of the impedance matching of the RX antenna 102 is performed so as to be independent of variation in receiver performance.

Figure 2A:
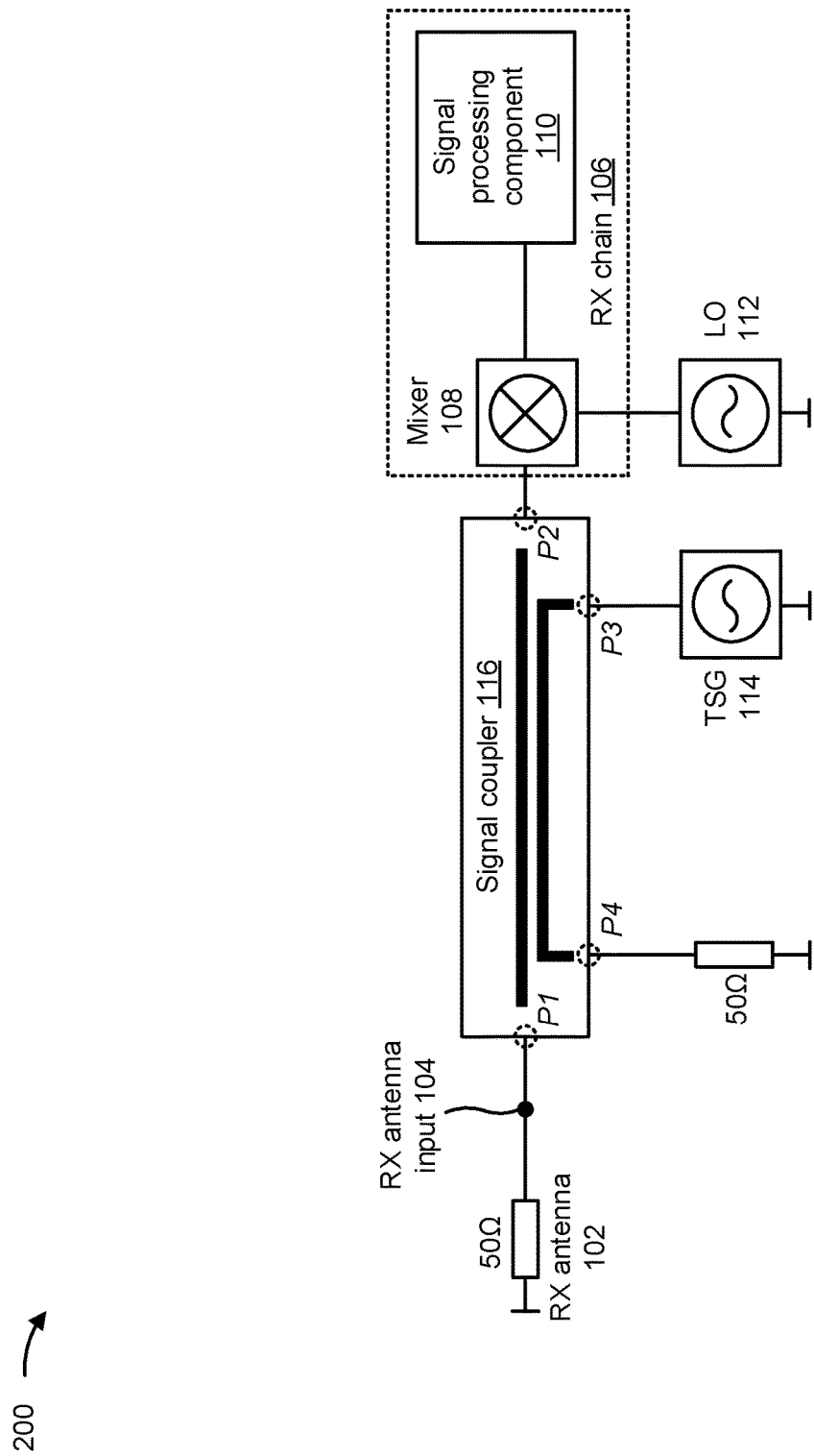
FIGS. 2A-2E are diagrams associated with a second example implementation of an RF device capable of monitoring impedance matching of an RX antenna or monitoring an RX chain using a test signal, as described herein.

For example, in addition to operation in the first test mode described above with respect to FIG. 1A, the RF device 100 may in some implementations be capable of operating in a second test mode. That is, the RF device 100 may be configured such that the RF device 100 can switch from operation in the first test mode (e.g., illustrated in FIG. 1A) to operating in the second test mode, and vice versa. FIG. 2A illustrates an implementation of the RF device 100 during operation in the second test mode (also referred to herein as an incident signal test mode). Notably, in FIG. 2A, the TSG 114 is coupled to the port P3 of the signal coupler 116 and the port P4 of the signal coupler 116 is isolated (e.g., as compared to the TSG 114 being coupled to the port P4 and the port P3 being isolated during operation in the first test mode).

In an example operation of the RF device 100 in the second test mode, the TSG 114 generates a second test signal (e.g., which may have the same frequency and power as the first test signal). Here, the TSG 114 is coupled to the port P3 of the signal coupler 116 such that the signal coupler 116 injects the second test signal into the RX chain 106. Here, the signal coupler 116 is configured such that a power of a portion of the second test signal that is propagating in a direction toward the RX antenna 102 when the second test signal is injected at the port P3 is less than a power of a portion of the second test signal that is propagating in a direction toward the RX chain 106 when the second test signal is injected at the port P3. Continuing with this example, the second test signal is received at the RX chain 106 by the mixer 108. The mixer 108 utilizes the LO signal from the LO 112 to down-convert the second test signal to generate a second baseband signal, and provides the second baseband signal to the control circuit of the signal processing component 110. The control circuit then monitors the impedance matching of the RX antenna 102 further based on evaluating one or more characteristics of the second baseband signal.

Figure 2B:
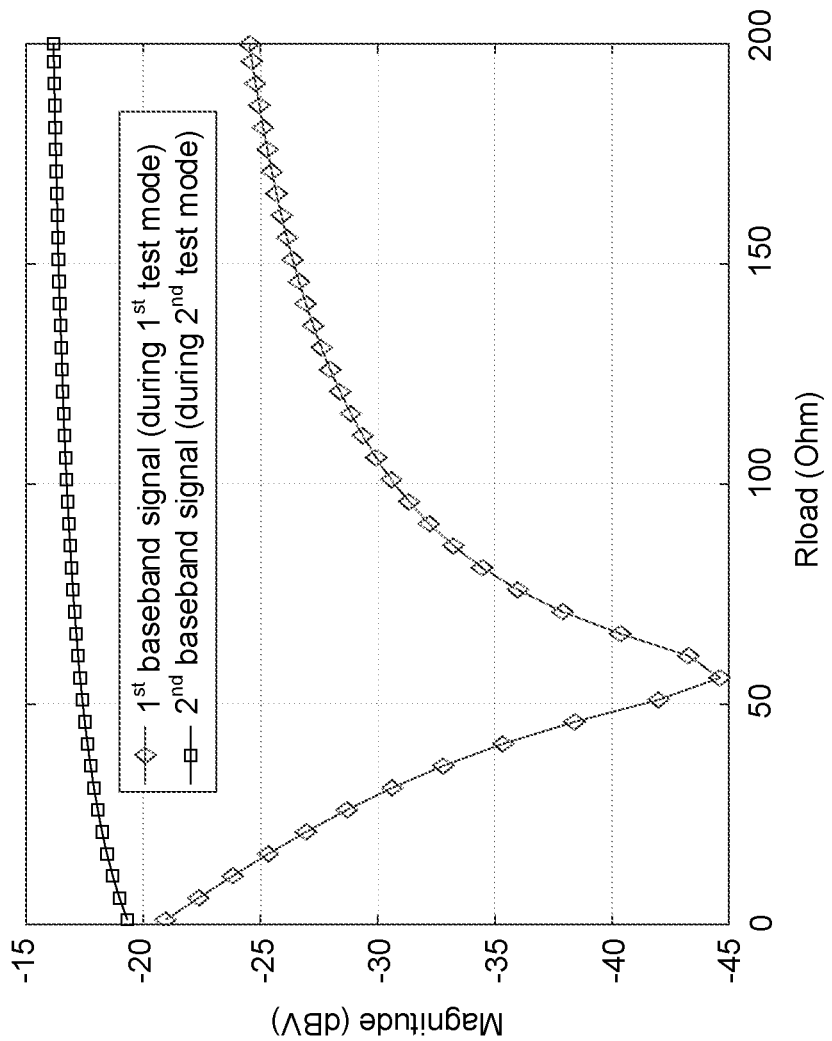
Figure 2C:
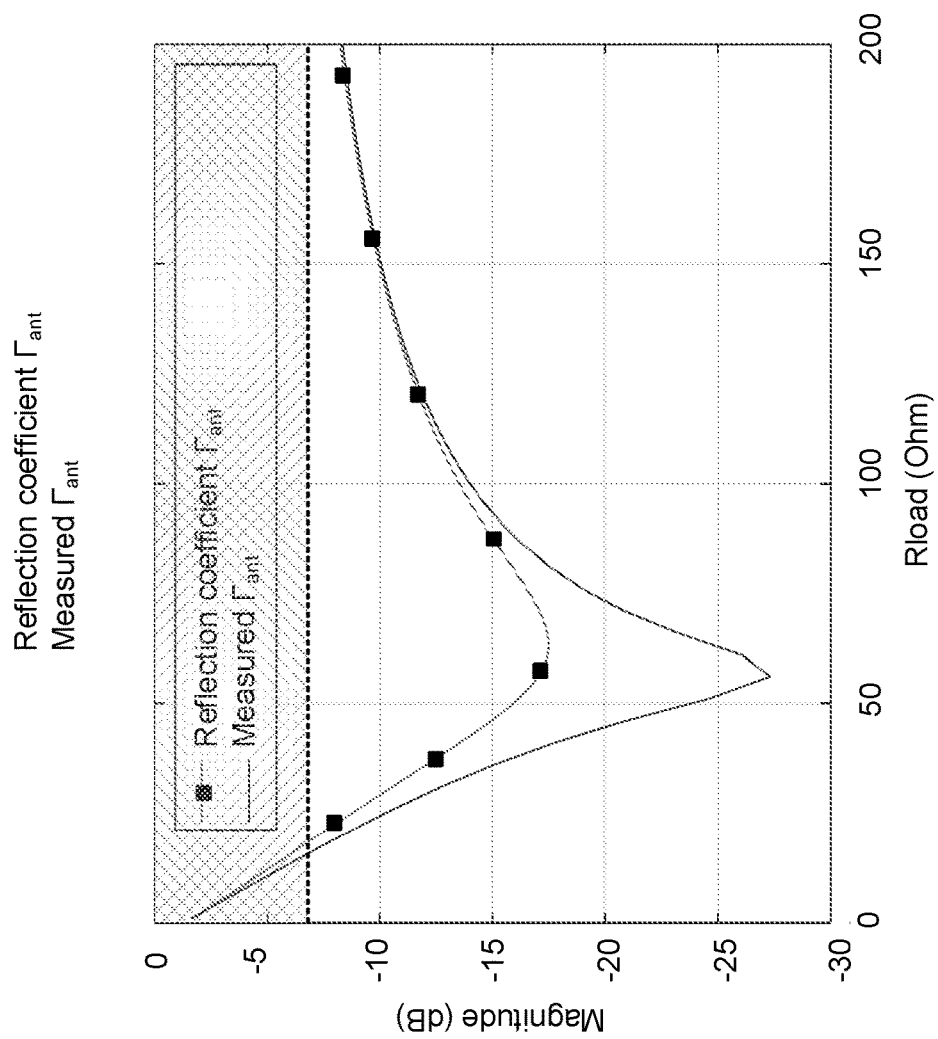

For example, in some implementations, the control circuit may monitor the impedance matching of the RX antenna 102 based on the magnitude of the first baseband signal and a magnitude of the second baseband signal. FIG. 2B is a diagram illustrating an example of signal magnitudes for the first baseband signal and the second baseband signal over a range of impedance. In FIG. 2B, an impedance of approximately 50Ω corresponds to a matched condition, meaning that the magnitude of the first baseband signal is expected to be at a low point. In some implementations, the control circuit may compute a reflection coefficient of the RX antenna 102 based at least in part on the magnitude of the first baseband signal and the magnitude of the second baseband signal. FIG. 2C is a diagram illustrating an example of actual and measured reflection coefficients ($\tau_{ant}$) over a range of impedance. In FIG. 2C, the measured reflection coefficients are computed based on magnitudes of the first and second baseband signal signals according to the formula:

$$\tau_{ant} = 20 \times \log_{10}(V_{ref}/V_{inc})$$

where $V_{ref}$ is the magnitude of the first baseband signal and Vine is the magnitude of the second baseband signal. In some implementations, the control circuit may compute the reflection coefficient using the formula noted above or in some other manner, such as by using another formula or using a lookup table, stored on the signal processing component 110, that associates combinations of first and second signal magnitudes with reflection coefficients.

In some implementations, the evaluation of the reflection coefficient of the RX antenna 102 includes determining whether the reflection coefficient satisfies a reflection coefficient threshold (e.g., an example reflection coefficient threshold of 6 dBV is shown in FIG. 2C). In FIG. 2C, an impedance of approximately 50Ω corresponds to a matched condition, meaning that the reflection coefficient is expected to be at a low point. In this example, if the control circuit determines that the reflection coefficient satisfies the reflection coefficient threshold (e.g., is less than or equal to the reflection coefficient threshold), then the control circuit may determine that the RX antenna 102 is matched (e.g., that the impedance of the RX antenna 102 is within an acceptable range). Alternatively, if the control circuit determines that the reflection coefficient does not satisfy the reflection coefficient threshold (e.g., is greater than the reflection coefficient threshold), then the control circuit may determine that the RX antenna 102 is mismatched (e.g., that the impedance of the RX antenna 102 is outside of the acceptable range).

In some implementations, the control circuit may evaluate the reflection coefficient in association with monitoring the impedance matching of the RX antenna 102 in some other manner, such as by providing the reflection coefficient as an input to a function that provides, as an output, an indication of the impedance matching of the RX antenna 102.

In the example associated with FIGS. 2A-2C, the RF device 100 operates in the first test mode (e.g., as described above in association with FIG. 1A) and the second test mode (e.g., as described in association with FIG. 2A). That is, in some implementations, the RF device 100 switches between the first test mode and the second test mode in association with monitoring the impedance matching of the RX antenna 102. Notably, the use of the second test mode (e.g., the monitoring of the impedance matching of the RX antenna 102 based at least in part on the second baseband signal) in conjunction with the first test mode provides monitoring of the impedance matching of the RX antenna 102 that is independent of variation in receiver performance, thereby improving reliability and robustness of the monitoring of the impedance matching of the RX antenna 102.

Additionally, in some implementations, the control circuit may be configured to monitor the RX chain 106 based on evaluating one or more characteristics of the second baseband signal. That is, in some implementations, the control circuit may use the second baseband signal, obtained during the second test mode, for monitoring the RX chain 106 of the RF device 100.

Figure 2D:
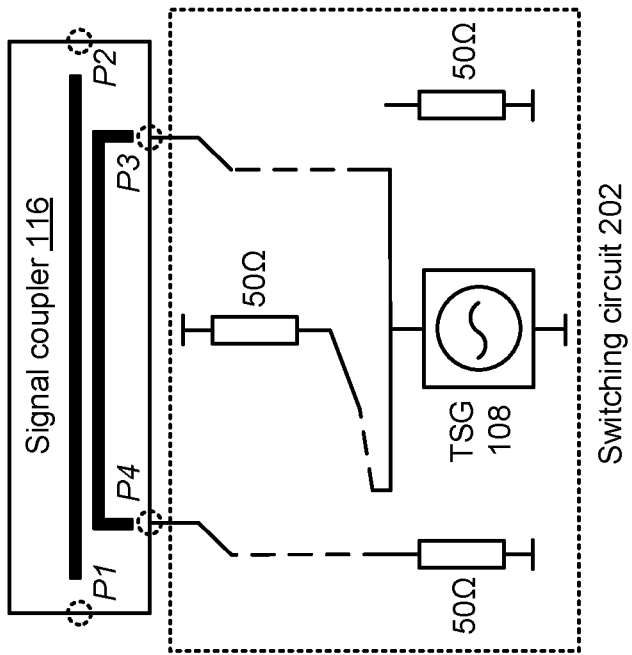
Figure 2D:
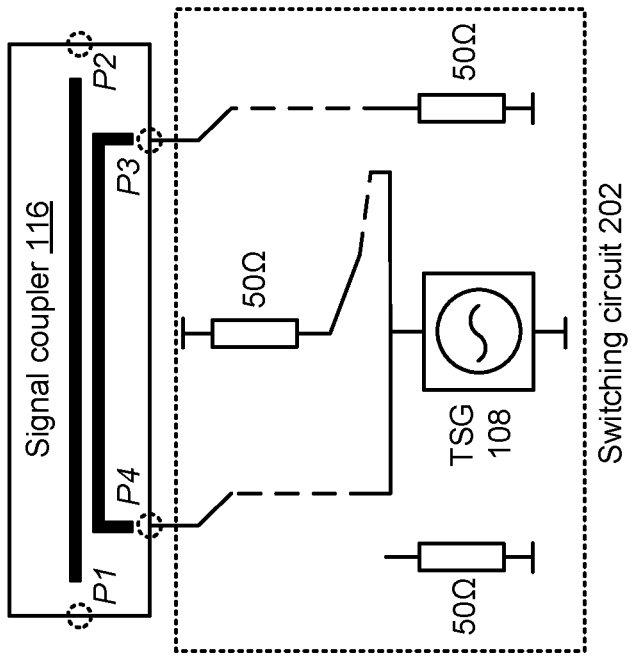
Figure 2E:
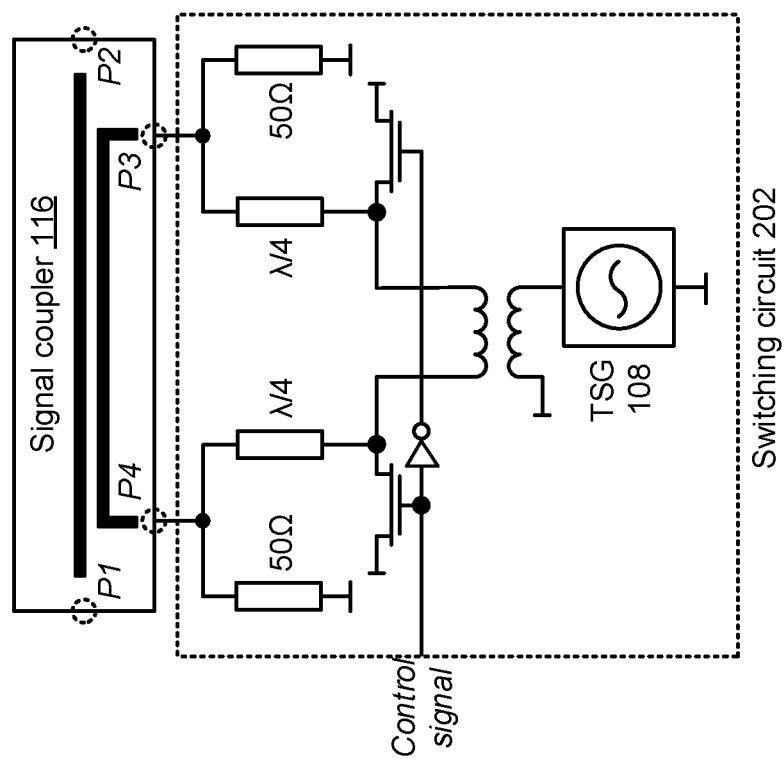

FIGS. 2D and 2E are diagrams illustrating example implementations of a switching circuit 202 that enables the RF device 100 to switch between operation in the first test mode and operation in the second test mode. In operation, the switching circuit 202 is a circuit that causes the first test signal to be injected into the RX antenna 102 via the port P4 of the signal coupler 116 during the operation in the first test mode and causes the second test signal to be injected into the RX chain 106 via the port P3 of the signal coupler 116 during the operation in the second test mode.

In one example implementation, as shown in FIG. 2D, the switching circuit 202 includes three single pole double throw (SPDT) switches. The switches of the switching circuit 202 are controlled using a control signal (not shown). The left diagram in FIG. 2D illustrates a configuration of the SPDT switches during operation in the first test mode (e.g., when the control signal is at a first level), while the right diagram in FIG. 2D illustrates a configuration of the SPDT switches during operation in the second test mode (e.g., when the control signal is at a second level). As shown in this example, in both modes of operation, the isolated port of the signal coupler 116 (e.g., the port P3 during operation the first test mode, the port P4 during operation in the second test mode) is coupled to a 50Ω termination. An implementation such as that shown in FIG. 2D provides monitoring of the impedance matching of the RX antenna 102 and the monitoring of the RX chain 106 using a switching circuit 202 that is relatively simple to implement.

In another example implementation, as shown in FIG. 2E, the switching circuit 202 includes a transformer, two quarter-wave (λ/4) transformers, and two switches. The switches of the switching circuit 202 are controlled using a control signal. In operation in the first test mode, the control signal is at a first level (e.g., low). This causes an inverter level to be at a second level (e.g., high), which (1) turns a left transistor off and therefore closes a switch on the left path of the switching circuit 202 and (2) turns a right transistor on and therefore opens a switch on the right path of the switching circuit 202. This configuration provides an RF short connected to the right path of the transformer. The power of the test signal generated by the TSG 114 is coupled via the port P4 toward the RX antenna 102. Here, the port P3 should be 50Ω terminated, and so the λ/4 transformer on the right path of the signal coupler 116 converts the RF short on the right path to an RF open, meaning that the signal coupler 116 sees only the 50Ω load from the right arm on the right path of the signal coupler 116. In operation in the second test mode, the control signal is at a second level (e.g., high). This causes the inverter level to be at the first level (e.g., low), which (1) turns the left transistor on and therefore opens the switch on the left path of the switching circuit 202 and (2) turns the right transistor off and therefore closes the switch on the right path of the switching circuit 202. This configuration provides an RF short connected to the left path of the transformer. The power of the test signal generated by the TSG 114 is coupled via the port P3 toward the RX chain 106. Here, the port P4 should be 50Ω terminated, and so the λ/4 transformer on the left path of the signal coupler 116 converts the RF short on the left path to an RF open, meaning that the signal coupler 116 sees only the 50Ω load from the left arm on the left path of the signal coupler 116. An implementation such as that shown in FIG. 2E provides monitoring of the impedance matching of the RX antenna 102 and the monitoring of the RX chain 106 using a switching circuit 202 that consumes a relatively small amount of chip area.

As indicated above, FIGS. 2A-2E are provided as an example. Other examples may differ from what is described with regard to FIGS. 2A-2E. The number and arrangement of components shown in FIGS. 2A-2E are provided as an example. In practice, there may be additional components, fewer components, different components, or differently arranged components than those shown in FIGS. 2A-2E. Furthermore, two or more components shown in FIGS. 2A-2E may be implemented within a single component, or a single component shown in FIGS. 2A-2E may be implemented as multiple, distributed components. Additionally, or alternatively, a set of components (e.g., one or more components) shown in FIGS. 2A-2E may perform one or more functions described as being performed by another set of components shown in FIGS. 2A-2E.

Figure 3A:
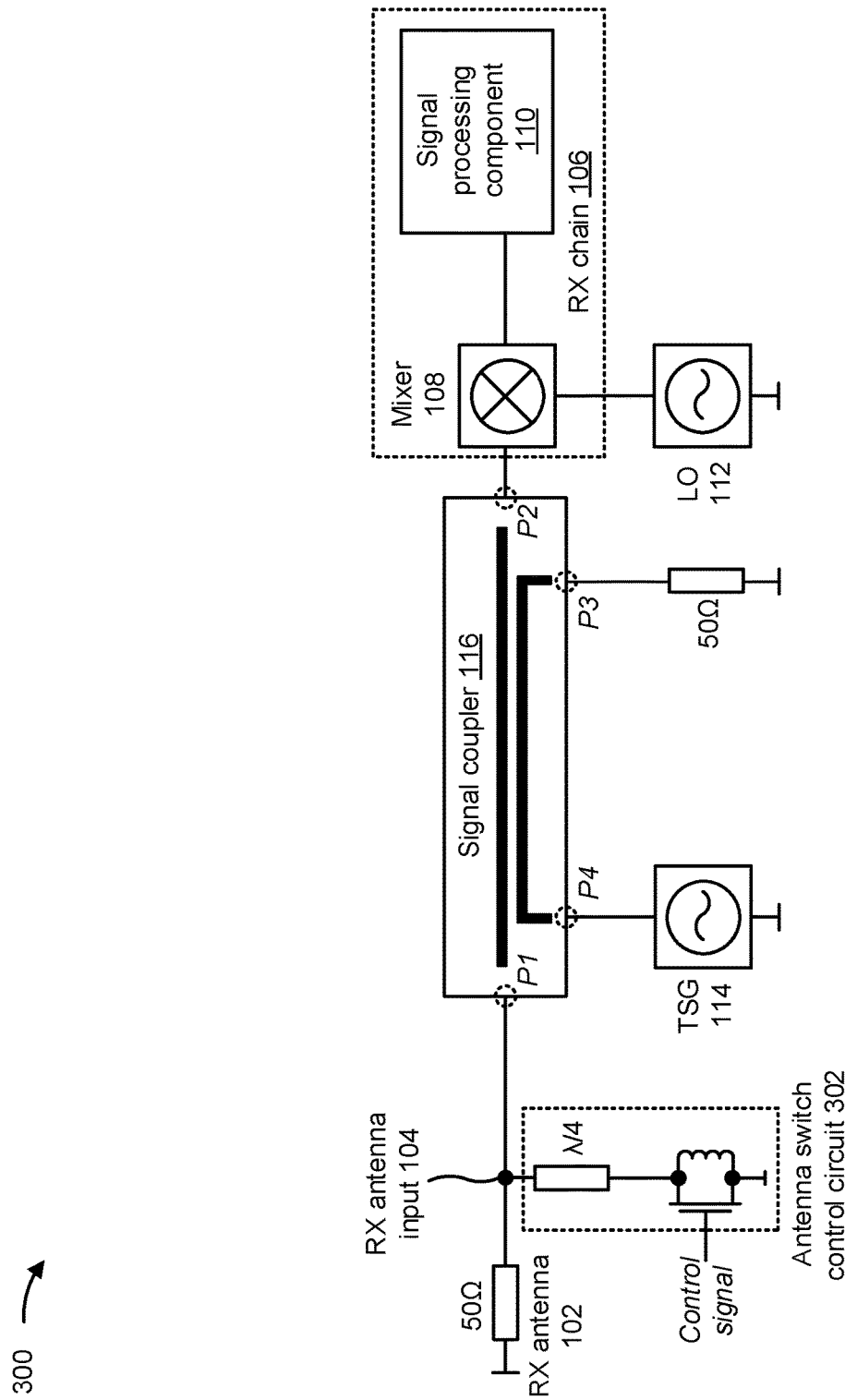
FIGS. 3A-3C are diagrams associated with a third example implementation of an RF device capable of monitoring impedance matching of an RX antenna or monitoring an RX chain using a test signal, as described herein.
Figure 3B:
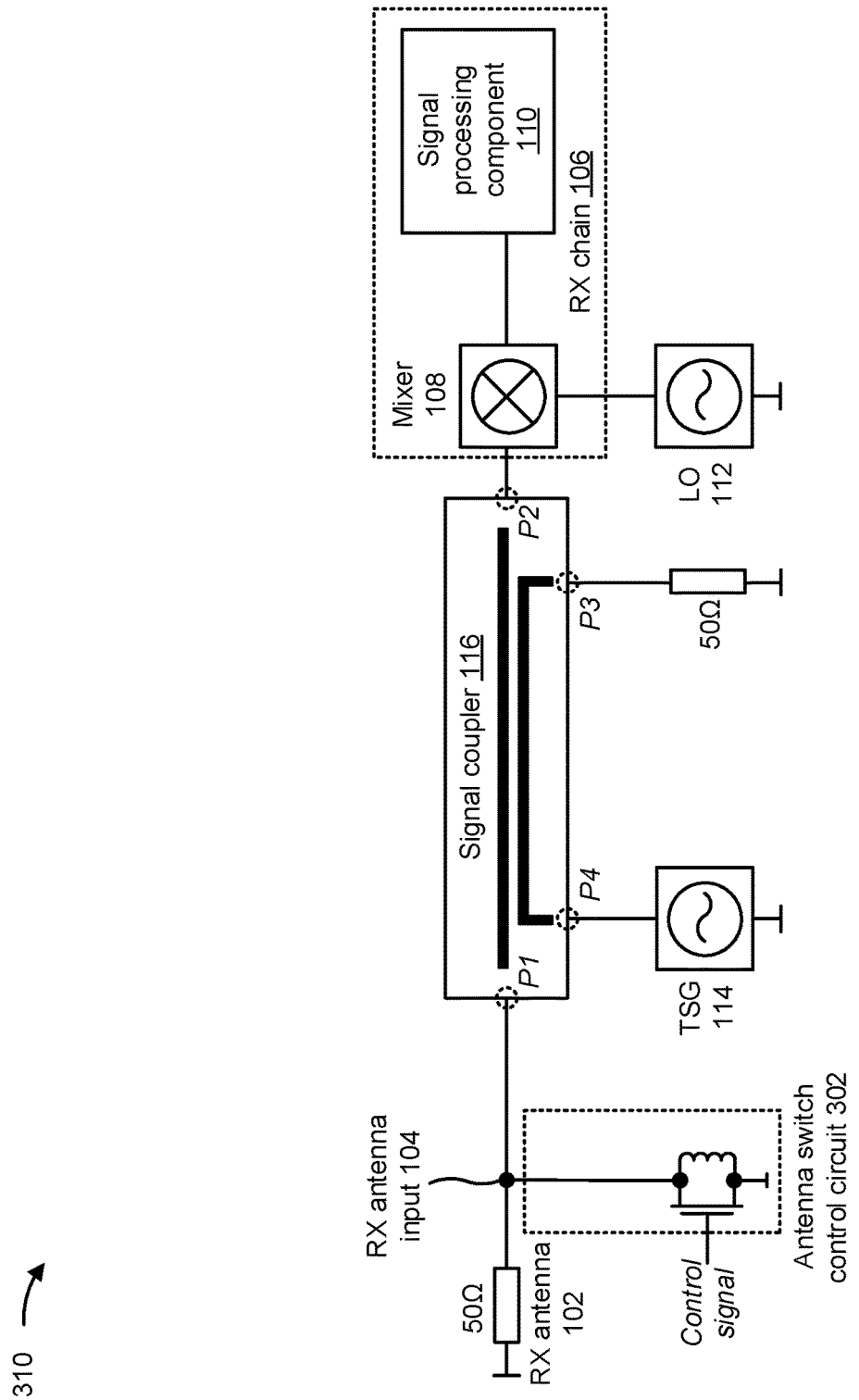
Figure 3C:
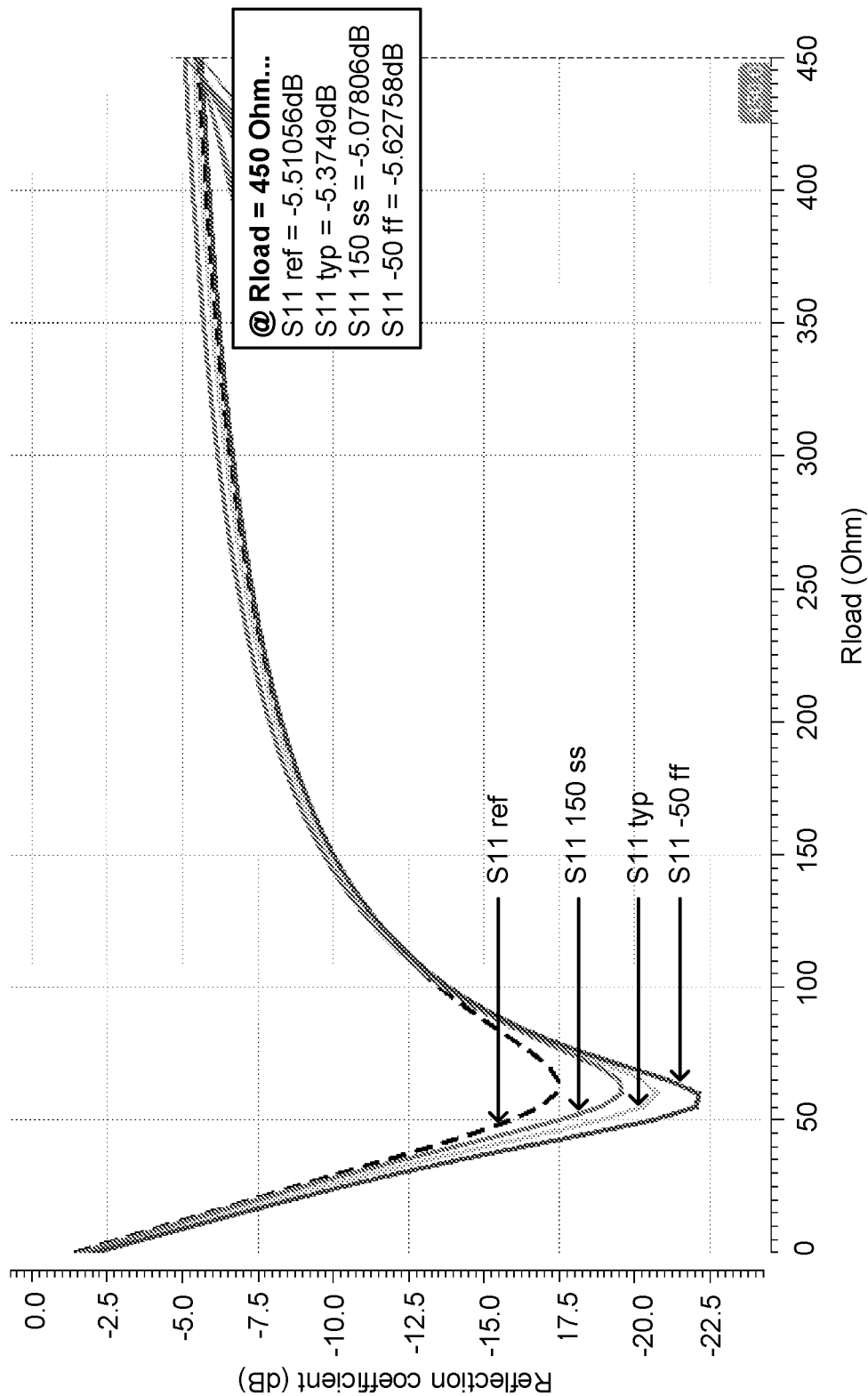

FIGS. 3A-3C are diagrams associated with a third example implementation of an RF device 100 capable of monitoring impedance matching of an RX antenna or monitoring an RX chain using a test signal. In the third example implementation of the RF device 100, the monitoring of the impedance matching of the RX antenna 102 is performed so as to be independent of variation in receiver performance, while also enabling monitoring of complex impedance, providing interference suppression during monitoring, and providing accurate RF terminations during production tests associated with the RF device 100.

In some implementations, the RF devices 100 shown in FIGS. 3A and 3B can selectively operate in the first test mode or the second test mode in order to enable monitoring of the impedance matching of the RX antenna 102 or monitoring of the RX chain 106 in the manner described above. That is, the RF device 100 may be configured such that the RF device 100 can switch from operation in the first test mode to operating in the second test mode, and vice versa. In some implementations, the switching of the RF device 100 between the first test mode and the second test mode is provided by an antenna switch control circuit 302. The antenna switch circuit 302 is circuit configured to cause the first test signal to be injected into the RX antenna 102 during the operation in the first test mode by providing an RF open at the RX antenna input 104, and to cause the second test signal to be injected into the RX chain 106 during the operation in the second test mode by providing an RF short at the RX antenna input 104.

In one example implementation, as shown in FIG. 3A, the antenna switch control circuit 302 includes a transformer, a λ/4 transformer, and a switch. The switch of the antenna switch control circuit 302 is controlled using a control signal. In operation in the first test mode, the control signal is at a level that causes the switch of the antenna switch circuit 302 to provide an RF short, which the λ/4 transformer converts to an RF open at the RX antenna input 104. This enables the first test signal, coupled to the port P4 of the signal coupler 116, to be reflected by the RX antenna 102, as described herein regarding the operation in the first test mode. In operation in the second test mode, the control signal is at a level that causes the switch of the antenna switch circuit 302 to provide an RF open, which the N4 transformer converts to an RF short at the RX antenna input 104. In some implementations, an implementation of the antenna switch control circuit 302 shown in FIG. 3A enables simplified ESD compliance and is relatively simple to implement due to ease of access of the switch to the RX path.

In another example implementation, as shown in FIG. 3B, the antenna switch control circuit 302 includes a transformer and a switch. The switch of the antenna switch control circuit 302 is controlled using a control signal. In operation in the first test mode, the control signal is at a level that causes the switch of the antenna switch circuit 302 to provide an RF open at the RX antenna input 104. This enables the first test signal, coupled to the port P4 of the signal coupler 116, to be reflected by the RX antenna 102, as described herein regarding the operation in the first test mode. In operation in the second test mode, the control signal is at a level that causes the switch of the antenna switch circuit 302 to provide an RF short at the RX antenna input 104. In some implementations, an implementation of the antenna switch control circuit 302 shown in FIG. 3B requires a relatively small chip area (e.g., since no λ/4 transformer is needed), is nearly PVT independent, provides improved interference suppression, and has a high interference suppression bandwidth. It is to be noted that in FIGS. 3A and 3B the TSG 114 is coupled to port P4 during the first test mode to test the impedance matching for detecting failures in the antenna connection and the TSG 114 is coupled also to the same port P4 for the second test mode for testing the RX chain 106.

FIG. 3C is a diagram illustrating an example of simulation results comparing an actual reflection coefficient and reflection coefficients measured using an RF device 100 including the implementation of the antenna switch control circuit 302 shown in FIG. 3B. In FIG. 3C, the "S11 ref" line indicates the reflection coefficient (e.g., as seen from an MMIC side toward the RX antenna 102). The "S11 typ" line, the "S11 150 ss" line, and the "S11-50 ff" show reflection coefficients as determined by the RF device 100 including the implementation of the antenna switch control circuit 302 shown in FIG. 3B (e.g., using the first and second test mode, as described herein). The "S11 typ" line shows results under room temperature and nominal process, the "S11 150 ss" line shows results at a temperature of 150 degrees Celsius and slow-slow corner, and the "S11-50 ff" line shows results at a temperature of 50 degrees Celsius and fast-fast corner. As can be understood from the comparison shown in FIG. 3C, the RF device 100 including the implementation of the antenna switch control circuit 302 shown in FIG. 3B provides good correlation for reflection coefficient values, particularly for reflection coefficient values greater than approximately-15 dB. This means that monitoring of the impedance matching of the RX antenna 102 or of the RX chain 106 provided by the RF device 100 including the antenna switch control circuit 302 is reliable.

As indicated above, FIGS. 3A-3C are provided as an example. Other examples may differ from what is described with regard to FIGS. 3A-3C. The number and arrangement of components shown in FIGS. 3A-3C are provided as an example. In practice, there may be additional components, fewer components, different components, or differently arranged components than those shown in FIGS. 3A-3C. Furthermore, two or more components shown in FIGS. 3A-3C may be implemented within a single component, or a single component shown in FIGS. 3A-3C may be implemented as multiple, distributed components. Additionally, or alternatively, a set of components (e.g., one or more components) shown in FIGS. 3A-3C may perform one or more functions described as being performed by another set of components shown in FIGS. 3A-3C.

FIG. 4 is a flowchart of an example processes relating to monitoring impedance matching of a receive antenna using a test signal.

As shown in FIG. 4, process 400 may include injecting a first test signal into a receive antenna of a device via a receive antenna input using a first port of a signal coupler during operation in a first test mode (block 410). For example, the signal coupler 116 may inject a first test signal (e.g., generated by the test signal generator 114) into the receive antenna 102 of the device 100 via the receive antenna input 104 using a first port of the signal coupler 116 during operation in a first test mode (e.g., the reflected signal test mode), as described above.

As further shown in FIG. 4, process 400 may include receiving a first reflected signal resulting from the first test signal being injected into the receive antenna during the operation in the first test mode (block 420). For example, the mixer 108 may receive a first reflected signal resulting from the first test signal being injected into the receive antenna 102 during the operation in the first test mode, as described above.

As further shown in FIG. 4, process 400 may include down-converting the first reflected signal to generate a first baseband signal (block 430). For example, the mixer 108 may down-convert the first reflected signal to generate a first baseband signal, as described above.

As further shown in FIG. 4, process 400 may include monitoring an impedance matching of the receive antenna based on evaluating one or more characteristics of the first baseband signal (block 440). For example, the control circuit (e.g., included in the signal processing component 110) may monitor an impedance matching of the receive antenna 102 based on evaluating one or more characteristics of the first baseband signal, as described above.

Process 400 may include additional implementations, such as any single implementation or any combination of implementations described below and/or in connection with one or more other processes described elsewhere herein.

In a first implementation, the signal coupler 116 is configured such that a power of a portion of the first test signal that is propagating in a direction toward the receive antenna 102 when the first test signal is injected at the first port is higher than a power of a portion of the first test signal that is propagating in a direction toward the receive chain 106 when the first test signal is injected at the first port.

In a second implementation, alone or in combination with the first implementation, a directivity of the signal coupler 116 is greater than or equal to approximately 10 dB.

In a third implementation, alone or in combination with one or more of the first and second implementations, a frequency of the first test signal is greater than approximately 10 GHz and in an operating range of the receive antenna 102.

In a fourth implementation, alone or in combination with one or more of the first through third implementations, the signal coupler 116 is a four-port device, and a third port of the signal coupler 116 is coupled to the receive antenna input 104 and a fourth port of the signal coupler 116 is coupled to the receive chain 106.

In a fifth implementation, alone or in combination with one or more of the first through fourth implementations, the one or more characteristics of the first baseband signal include a magnitude of the first baseband signal, and the impedance matching of the receive antenna 102 is monitored based at least in part on an evaluation of the magnitude of the first baseband signal.

In a sixth implementation, alone or in combination with one or more of the first through fifth implementations, the one or more characteristics of the first baseband signal include a phase of the first baseband signal, and the impedance matching of the receive antenna 102 is monitored based at least in part on an evaluation of the phase of the first baseband signal.

In a seventh implementation, alone or in combination with one or more of the first through sixth implementations, the control circuit, when monitoring the impedance matching of the receive antenna 102, is configured to monitor a complex value of an impedance of the receive antenna 102.

In an eighth implementation, alone or in combination with one or more of the first through seventh implementations, the monitoring of the impedance matching of the receive antenna 102 is associated with at least one of detecting a ball break or a partial ball break associated with a connection of the receive antenna 102, detecting an RF short at the receive antenna 102, detecting an RF open at the receive antenna 102, or detecting fatigue on a signal path of the receive chain 106.

In a ninth implementation, alone or in combination with one or more of the first through eighth implementations, the process 400 includes injecting, by the signal coupler 116, a second test signal into the receive chain 106 during operation in a second test mode (e.g., the incident signal test mode), where the signal coupler 116 is configured such that a power of a portion of the second test signal that is propagating in a direction toward the receive antenna 102 when the second test signal is injected at the second port is lower than a power of a portion of the second test signal that is propagating in a direction toward the receive chain 106 when the second test signal is injected at the second port.

In a tenth implementation, in combination with the ninth implementation, the mixer 108 is configured to down-convert the second test signal to generate a second baseband signal, and the control circuit is configured to monitor the impedance matching of the receive antenna 102 further based on one or more characteristics of the second baseband signal.

In an eleventh implementation, in combination with one or more of the ninth and tenth implementations, the mixer 108 is configured to down-convert the second test signal to generate a second baseband signal, and the control circuit is configured to monitor the receive chain 106 based on evaluating one or more characteristics of the second baseband signal.

In a twelfth implementation, in combination with one or more of the ninth through eleventh implementations, the process 400 includes generating, by an ADC included in the receive chain 106, a digitized version of the first reflected signal during the operation in the first test mode and a digitized version of the second test signal during the operation in the second test mode, and processing, by a digital Fourier transformation circuit included in the receive chain 106, the digitized version of the first reflected signal and the digitized version of the second test signal.

In a thirteenth implementation, in combination with one or more of the ninth through twelfth implementations, the process 400 includes computing, by the control circuit, a reflection coefficient of the receive antenna 102 based on the first baseband signal and a second baseband signal resulting from the second test signal being injected into the receive chain 102, where monitoring the impedance matching of the receive antenna comprises evaluating the reflection coefficient of the receive antenna 102.

In a fourteenth implementation, in combination with one or more of the ninth through thirteenth implementations, the process 400 includes causing, by the switching circuit 202, the first test signal to be injected into the receive antenna 102 via the first port of the signal coupler 116 during the operation in the first test mode, and causing, by the switching circuit 202, the second test signal to be injected into the receive chain 106 via a second port of the signal coupler 116 during the operation in the second test mode.

In a fifteenth implementation, in combination with the fourteenth implementation, the switching circuit 202 comprises a transformer, two quarter-wave transformers, and two switches.

In a sixteenth implementation, in combination with the fourteenth implementation, the switching circuit 202 comprises three SPDT switches.

In a seventeenth implementation, in combination with one or more of the ninth through thirteenth implementations, the process 400 includes causing, by the antenna switch control circuit 302, the first test signal to be injected into the receive antenna during the operation in the first test mode by providing an RF open at the receive antenna input 104, and causing, by the antenna switch control circuit 302, the second test signal to be injected into the receive chain 106 during the operation in the second test mode by providing an RF short at the receive antenna input 104.

In an eighteenth implementation, in combination with the seventeenth implementation, the antenna switch control circuit 302 comprises a transformer, a quarter wave transformer, and a switch.

In a nineteenth implementation, in combination with the seventeenth implementation, the antenna switch control circuit 302 comprises a transformer and a switch.

Although FIG. 4 shows example blocks of process 400, in some implementations, process 400 includes additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "component" is intended to be broadly construed as hardware, firmware, and/or a combination of hardware and software. It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items,), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A device, comprising:
   a receive antenna input to couple a receive antenna to a receive chain of the device;
   a test signal generator to generate a first test signal;
   a signal coupler between the receive antenna input and the receive chain, the signal coupler comprising a first port to inject the first test signal into the receive antenna via the receive antenna input during operation in a first test mode;
   a mixer, included in the receive chain, to:
      receive a first reflected signal resulting from the first test signal being injected into the receive antenna during the operation in the first test mode, and
      down-convert the first reflected signal to generate a first baseband signal; and
   a control circuit to:
      monitor an impedance matching of the receive antenna based on evaluating one or more characteristics of the first baseband signal, and
      evaluate a connection of the receive antenna based on monitoring the impedance matching of the receive antenna.

2. The device of claim 1, wherein the signal coupler is configured such that a power of a portion of the first test signal that is propagating in a direction toward the receive antenna when the first test signal is injected at the first port is higher than a power of a portion of the first test signal that is propagating in a direction toward the receive chain when the first test signal is injected at the first port.

3. The device of claim 1, wherein a directivity of the signal coupler is greater than or equal to approximately 10 decibels (dB).

4. The device of claim 1, wherein a frequency of the first test signal is greater than approximately 10 gigahertz (GHz) and is in an operating range of the receive antenna.

5. The device of claim 1, wherein the signal coupler is a four-port device, and wherein a third port of the signal coupler is coupled to the receive antenna input and a fourth port of the signal coupler is coupled to the receive chain.

6. The device of claim 1, wherein the one or more characteristics of the first baseband signal include a magnitude of the first baseband signal, and the impedance matching of the receive antenna is monitored based at least in part on an evaluation of the magnitude of the first baseband signal.

7. The device of claim 1, wherein the one or more characteristics of the first baseband signal include a phase of the first baseband signal, and the impedance matching of the receive antenna is monitored based at least in part on an evaluation of the phase of the first baseband signal.

8. The device of claim 1, wherein the control circuit, when monitoring the impedance matching of the receive antenna, is configured to monitor a complex value of an impedance of the receive antenna.

9. The device of claim 1, wherein, when evaluating the connection of the receive antenna, the control circuit is to at least one of:
   detect a ball break or a partial ball break associated with a connection of the receive antenna,
   detect a radio frequency (RF) short at the receive antenna,
   detect an RF open at the receive antenna, or
   detect fatigue on a signal path of the receive chain.

10. The device of claim 1, wherein the signal coupler is further configured to inject a second test signal into the receive chain during operation in a second test mode, wherein the signal coupler is configured such that a power of a portion of the second test signal that is propagating in a direction toward the receive antenna when the second test signal is injected at a second port is lower than a power of a portion of the second test signal that is propagating in a direction toward the receive chain when the second test signal is injected at the second port.

11. The device of claim 10, wherein the mixer is configured to down-convert the second test signal to generate a second baseband signal, and the control circuit is configured to monitor the impedance matching of the receive antenna further based on one or more characteristics of the second baseband signal.

12. The device of claim 10, wherein the mixer is configured to down-convert the second test signal to generate a second baseband signal, and the control circuit is configured to monitor the receive chain based on evaluating one or more characteristics of the second baseband signal.

13. The device of claim 10, further comprising:
   an analog-to-digital converter, included in the receive chain, configured to:
      generate a digitized version of the first reflected signal during the operation in the first test mode,
      generate a digitized version of the second test signal during the operation in the second test mode; and
   a digital Fourier transformation circuit, included in the receive chain, configured to:
      process the digitized version of the first reflected signal, and
      process the digitized version of the second test signal.

14. The device of claim 10, wherein the control circuit is further to:
   compute a reflection coefficient of the receive antenna based on the first baseband signal and a second baseband signal resulting from the second test signal being injected into the receive chain, and wherein the control circuit, when monitoring the impedance matching of the receive antenna, is to evaluate the reflection coefficient of the receive antenna.

15. The device of claim 10, further comprising a switching circuit to:
   cause the first test signal to be injected into the receive antenna via the first port of the signal coupler during the operation in the first test mode, and
   cause the second test signal to be injected into the receive chain via a second port of the signal coupler during the operation in the second test mode.

16. The device of claim 15, wherein the switching circuit comprises a transformer, two quarter-wave transformers, and two switches.

17. The device of claim 15, wherein the switching circuit comprises three single pole double throw (SPDT) switches.

18. The device of claim 10, further comprising an antenna switch control circuit configured to:
   cause the first test signal to be injected into the receive antenna during the operation in the first test mode by providing a radio frequency (RF) open at the receive antenna input; and
   cause the second test signal to be injected into the receive chain during the operation in the second test mode by providing an RF short at the receive antenna input.

19. The device of claim 18, wherein the antenna switch control circuit comprises a transformer, a quarter wave transformer, and a switch.

20. The device of claim 18, wherein the antenna switch control circuit comprises a transformer and a switch.

21. A method, comprising:
   injecting a first test signal into a receive antenna of a device via a receive antenna input using a first port of a signal coupler during operation in a first test mode;
   receiving a first reflected signal resulting from the first test signal being injected into the receive antenna during the operation in the first test mode;
   down-converting the first reflected signal to generate a first baseband signal;
   monitoring an impedance matching of the receive antenna based on evaluating one or more characteristics of the first baseband signal; and
   evaluating a connection of the receive antenna based on monitoring the impedance matching of the receive antenna.

22. A device, comprising:
a signal coupler configured to:
   inject a first test signal into a receive antenna via a receive antenna input during operation in a first test mode, and
   inject a second test signal into a receive chain during operation in a second test mode; and
a control circuit to:
   monitor an impedance matching of the receive antenna based at least in part on one or more characteristics associated with a reflected signal resulting from the first test signal being injected into the receive antenna during the operation in the first test mode,
   monitor the receive chain based at least in part on one or more characteristics associated with a signal resulting from the second test signal being injected into the receive chain during the operation in the second test mode; and
   evaluate a connection of the receive antenna based on monitoring the receive chain.

* * * * *